(12) United States Patent
Jeon

(10) Patent No.: US 7,973,342 B2
(45) Date of Patent: Jul. 5, 2011

(54) CMOS IMAGE SENSOR AND METHOD FOR MANUFACTURING THE SAME

(75) Inventor: In Gyun Jeon, Gunpo-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 145 days.

(21) Appl. No.: 12/391,104

(22) Filed: Feb. 23, 2009

(65) Prior Publication Data

US 2009/0159935 A1 Jun. 25, 2009

Related U.S. Application Data

(62) Division of application No. 11/580,387, filed on Oct. 12, 2006, now Pat. No. 7,510,896.

(30) Foreign Application Priority Data

Oct. 13, 2005 (KR) .................. 10-2005-0096363

(51) Int. Cl.
*H01L 27/146* (2006.01)

(52) U.S. Cl. .................. 257/233; 257/E27.132

(58) Field of Classification Search .................. 257/233, 257/292

See application file for complete search history.

(56) References Cited

U.S. PATENT DOCUMENTS

| | | | |
|---|---|---|---|
| 6,184,055 B1 * | 2/2001 | Yang et al. .................. 438/57 |
| 6,521,925 B1 * | 2/2003 | Mori et al. .................. 257/292 |
| 7,153,719 B2 * | 12/2006 | Patrick et al. .................. 438/60 |
| 7,427,734 B2 * | 9/2008 | Yang et al. .................. 250/208.1 |
| 7,605,440 B2 * | 10/2009 | Altice .................. 257/462 |
| 7,678,643 B2 * | 3/2010 | Jeon .................. 438/237 |
| 2002/0001039 A1 * | 1/2002 | Ishiwata .................. 348/308 |
| 2003/0169360 A1 | 9/2003 | Rhodes |
| 2005/0059180 A1 * | 3/2005 | Rhodes .................. 438/22 |
| 2005/0093036 A1 * | 5/2005 | Han .................. 257/291 |
| 2007/0069322 A1 | 3/2007 | Jeon |

\* cited by examiner

*Primary Examiner* — Benjamin P Sandvik

(74) *Attorney, Agent, or Firm* — The Law Offices of Andrew D. Fortney; Andrew D. Fortney

(57) ABSTRACT

Disclosed are a CMOS image sensor and a method for manufacturing the same, capable of improving the characteristics of the image sensor by increasing junction capacitance of a floating diffusion area. The CMOS image sensor generally includes a photodiode and a plurality of transistors (e.g., transfer, reset, drive, and select transistors), a first conductive type semiconductor substrate, having an active area including a photodiode area, a floating diffusion area, and a voltage input/output area, a gate electrode of each transistor on the active area, a first conductive type first well area in the semiconductor substrate corresponding to the voltage input/output area, a first conductive type second well area in the semiconductor substrate corresponding to the floating diffusion area, and a second conductive type diffusion area in the semiconductor substrate at opposed sides of each gate electrode.

20 Claims, 7 Drawing Sheets

CMOS IMAGE SENSOR AND METHOD FOR MANUFACTURING THE SAME

This application is a divisional of U.S. patent application Ser. No. 11/580,387, filed on Oct. 12, 2006, now U.S. Pat. No. 7,510,896 which is incorporated herein by reference in its entirety and which claims the benefit of the Korean Patent Application No. 10-2005-0096363, filed on Oct. 13, 2005, which is incorporated by reference herein in its entirety.

BACKGROUND OF THE INVENTION

1. Field of the Invention

The present invention relates to a CMOS image sensor. More specifically, the present invention relates to a CMOS image sensor and a method for manufacturing the same, capable of improving characteristics of the image sensor by reducing a leakage current of a floating diffusion area.

2. Description of the Related Art

In general, an image sensor is a semiconductor device for converting optical images into electric signals, and it may be classified as a charge coupled device (CCD) or a CMOS image sensor.

The CCD has a plurality of photodiodes (PDs), which are arranged in the form of a matrix in order to convert optical signals into electric signals. The CCD includes a plurality of vertical charge coupled devices (VCCDs) provided between photodiodes and vertically arranged in the matrix so as to transmit electric charges in the vertical direction when the electric charges are generated from each photodiode, a plurality of horizontal charge coupled devices (HCCDs) for transmitting the electric charges from the VCCDs in the horizontal direction, and a sense amplifier for outputting electric signals by sensing the electric charges being transmitted in the horizontal direction.

However, CCDs may have various disadvantages, such as a complicated drive mode, high power consumption, and so forth. Also, the CDD is generally manufactured using multi-step photo processes, so the manufacturing process for the CCD can be complicated.

In addition, since it can be difficult to integrate certain circuits, such as a controller, a signal processor, and an analog/digital converter (A/D converter) onto a single chip of the CCD, the CCD may not be advantageous for compact-size products.

Recently, the CMOS image sensor has been spotlighted as a next-generation image sensor capable of solving certain problems of the CCD.

The CMOS image sensor is a device employing a switching mode to sequentially detect an output of each unit pixel using MOS transistors, in which the MOS transistors are formed on a semiconductor substrate corresponding to the unit pixels through a CMOS technology. CMOS image sensors may also use peripheral circuits or devices, such as a controller and a signal processor.

That is, the CMOS sensor includes a photodiode and at least one MOS transistor in each unit pixel, and sequentially detects the electric signals of each unit pixel in a switching mode to realize images.

Since the CMOS image sensor makes use of the CMOS technology, the CMOS image sensor has advantages such as relatively low power consumption and a relatively simple manufacturing process with fewer photo processing steps.

In addition, the CMOS image sensor allows the product to have a compact size, because peripheral circuits such as a controller, signal processor, and A/D converter can be integrated onto the CMOS image sensor chip.

Therefore, CMOS image sensors have been extensively used in various applications, such as digital still cameras, digital video cameras, and so forth.

Meanwhile, the CMOS image sensors are classified into 3T type, 4T type, and 5T type CMOS image sensors according to the number of transistors per unit pixel. The 3T type CMOS image sensor includes one photodiode and three transistors per unit pixel, and the 4T type CMOS image sensor includes one photodiode and four transistors per unit pixel.

Hereinafter, description about the layout of a unit pixel of the 4T type CMOS image sensor will be given.

FIG. 1 is a circuit diagram of a conventional four transistor (4T) CMOS image sensor.

As shown in FIG. 1, a unit pixel 100 of the CMOS image sensor includes a photo diode 10 serving as an optical-electric converter and four transistors.

The four transistors include a transfer transistor 20, a reset transistor 30, a drive transistor 40, and a select transistor 50. In addition, a load transistor 60 is electrically connected to an output terminal OUT of each unit pixel 100.

In FIG. 1, FD, Tx, Rx, Dx, and Sx denote a floating diffusion area, a gate voltage of the transfer transistor 20, a gate voltage of the reset transistor 30, a gate voltage of the drive transistor 40, and a gate voltage of the select transistor 50, respectively.

FIG. 2 is a layout view showing the unit pixel of the conventional 4T CMOS image sensor, and FIG. 3 is a sectional view taken along line II-II' of FIG. 2 showing the conventional CMOS image sensor. FIG. 1 is a circuit schematic that is equivalent to the layout of FIG. 2.

As shown in FIGS. 2 and 3, the conventional 4T CMOS image sensor includes a P-well area 32, which is formed in a predetermined portion of a surface of a P type semiconductor substrate 31 on which an active area and an isolation area are defined, an isolation layer 34, which is formed in the isolation area of the semiconductor substrate 31, gate electrodes 23, 33, 43, and 53 of the four transistors, which are formed in the active area of the semiconductor substrate 31 with a gate insulating layer 35 between the gate electrodes and the active area, and a photodiode (PD) area, which is formed at one side of the gate electrode of the transfer transistor.

In other words, the transfer transistor 20 (see, FIG. 1), the reset transistor 30 (see, FIG. 1), the drive transistor 40 (see, FIG. 1), and the select transistor 50 (see, FIG. 1) include the gate electrodes 23, 33, 43, and 53, respectively.

High-density n+ type dopants are implanted into the active area of each transistor, except for the photodiode (PD) area and the parts of the substrate below the gate electrodes 23, 33, 43, and 53, with the same implantation depth, so that an N+ type diffusion area 36 (i.e., the source/drain areas of each transistor) is formed in the active area of each transistor.

Meanwhile, although they are not explained, reference character A represents an area where the N+ type diffusion area 36 is formed, and reference character B represents an area where the P-well area 32 is not formed.

Therefore, the FD area and the PD area are formed on the surface of the P type semiconductor substrate 31 instead of the P-well area 32.

In addition, the density of the P type semiconductor substrate 31 is within a range of $1E15/cm^3$ to $1E16/cm^3$, the density of the P-well area 32 except for the P type semiconductor substrate 31 is within a range of $1E17/cm^3$ to $1E18/cm^3$, and the density of the N+ diffusion area 36 is within a range of $1E20/cm^3$ to $1E22/cm^3$.

Meanwhile, the gate electrode 33 shown in FIG. 3 is a gate electrode of the reset transistor, and the N+ diffusion area 36 between the gate electrode 23 of the transfer transistor and the gate electrode 33 of the reset transistor is the FD area.

In addition, the bold solid line represents a connection line between the FD area and the drive transistor 40 (see, FIG. 1).

Since the P-well areas 32 in pixel areas have uniform density, the conventional CMOS image sensor has the same leakage current in the pixel areas and the same junction capacitance for a unit area.

However, it is very important to reduce a junction leakage current of an FD area in a CMOS image sensor having a structure of four (or more) transistors and one photodiode. This is because the potential of a FD area serves as the input potential of the drive transistor.

However, although the FD has no problem when a small number of electrons are carried from the photodiode, the FD cannot receive all carried electrons when a great amount of electrons are carried to the FD area (that is, when a large quantity of electrons are generated due to a great amount of light incident onto the photodiode) because the capacitor in the FD area has a relatively small capacitance.

That is, since the doping density of the P-type substrate is within a range of $1E15/cm^3$ to $1E16/cm^3$, a capacitance value of the FD area is reduced.

Accordingly, since it is difficult to receive a large amount of electrons from the photodiode, the exact potential cannot be applied to the drive transistor, so that a data failure or error may occur.

SUMMARY OF THE INVENTION

It is, therefore, an object of the present invention to provide a CMOS image sensor and a method for manufacturing the same, capable of improving a characteristic of the image sensor by increasing junction capacitance of a floating diffusion area.

According to a preferred embodiment of the present invention, a CMOS image sensor may include a photodiode and a plurality of transistors (e.g., transfer, reset, drive, and select transistors), a first conductive type semiconductor substrate having an active area including a photodiode area, a floating diffusion area, and a voltage input/output area, a gate electrode of each transistor on the active area of the semiconductor substrate with a gate insulating layer therebetween, a first conductive type first well area in the semiconductor substrate corresponding to the voltage input/output area, a first conductive type second well area in the semiconductor substrate corresponding to the floating diffusion area, and a second conductive type diffusion area in the semiconductor substrate at opposite sides of each gate electrode (except for the transfer transistor, which has the second conductive type diffusion area in the semiconductor substrate at only one side of its gate electrode).

According to another aspect of the present invention, there is provided a method for manufacturing a CMOS image sensor including a photodiode and a plurality of transistors (e.g., transfer, reset, drive, and select transistors), including the steps of forming a first conductive type first well area in a voltage input/output area of a first conductive type semiconductor substrate having an active area that includes a photodiode area, a floating diffusion area, and a voltage input/output area, forming a second conductive type second well area in the floating diffusion area of the semiconductor substrate, forming a gate insulating layer and a gate electrode of each transistor on the active area of the semiconductor substrate, and forming a second conductive type diffusion area in a surface of the semiconductor substrate at opposite sides of each gate electrode (except for the transfer transistor, which has the second conductive type diffusion area in the semiconductor substrate at only one side of its gate electrode).

DETAILED DESCRIPTION OF THE INVENTION

Hereinafter, a preferred embodiment according to the present invention will be described in detail, with reference to the following drawings.

Figure 4:
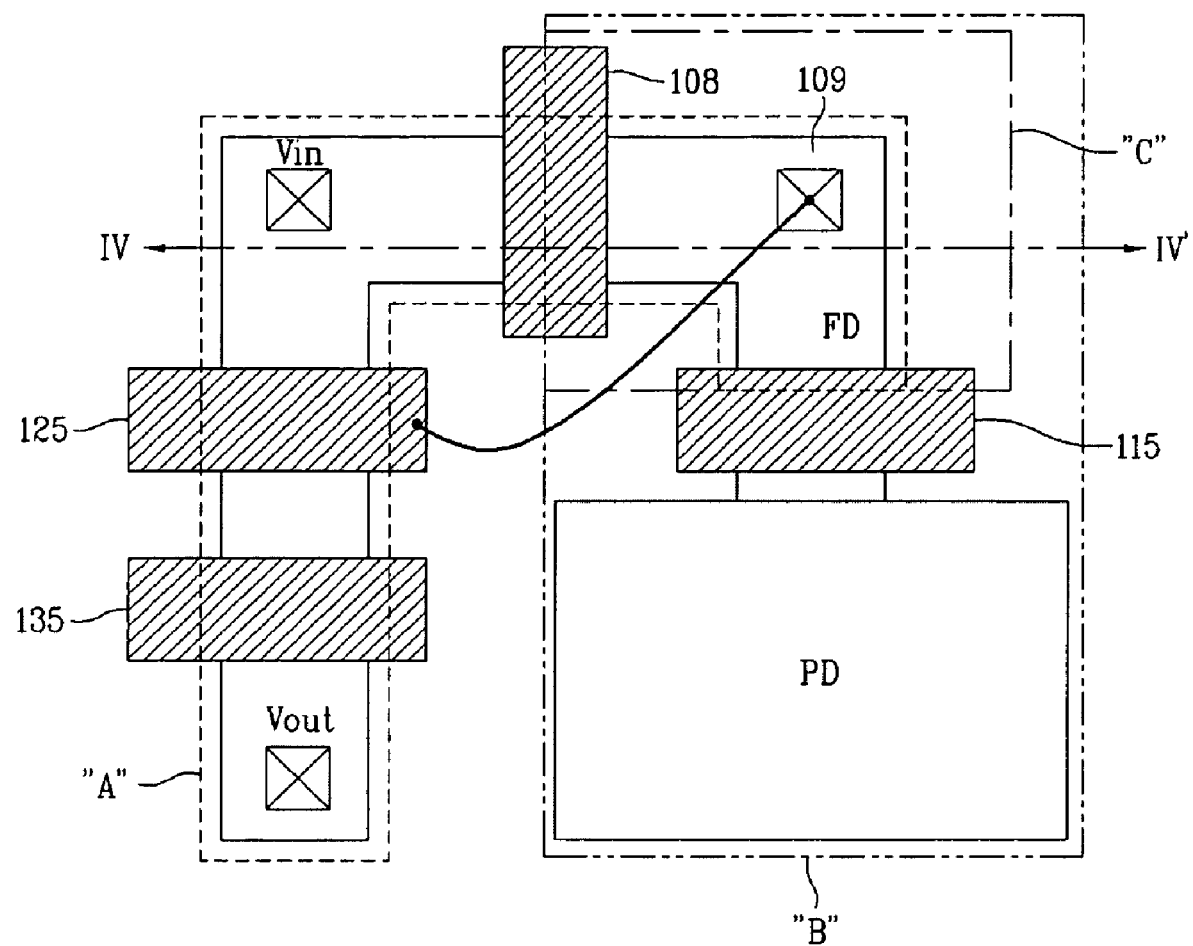
FIG. 4 is a layout view showing a unit pixel of a 4T CMOS image sensor according to the present invention.
Figure 5:
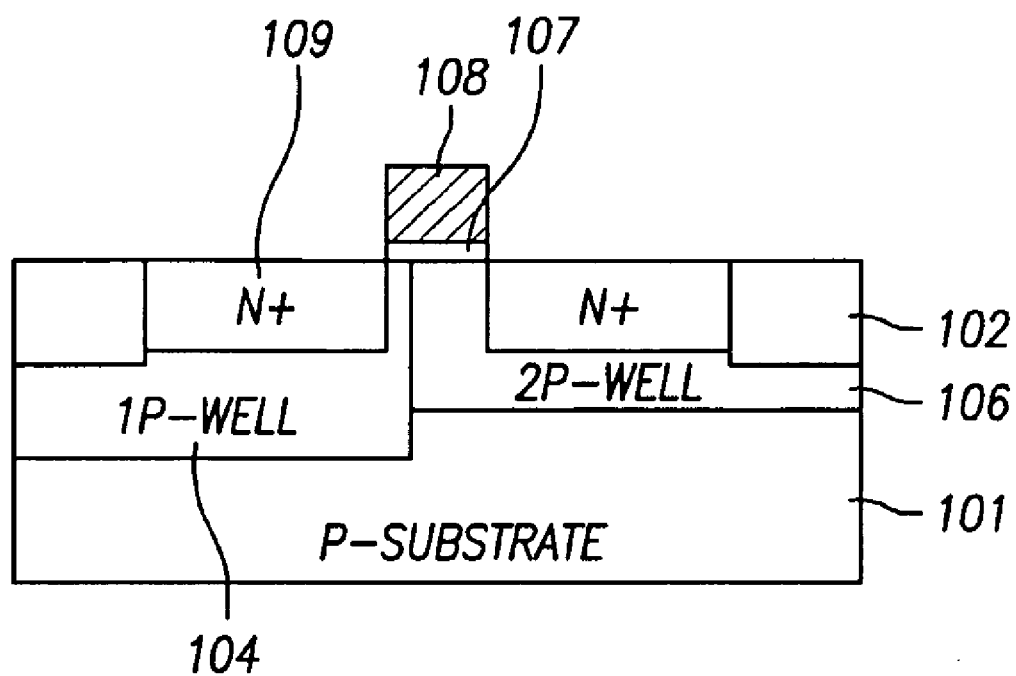
FIG. 5 is a sectional view taken along line IV-IV' of FIG. 4 showing a CMOS image sensor according to the present invention.

FIG. 4 is a layout view showing a unit pixel of a 4T CMOS image sensor according to the present invention, and FIG. 5 is a sectional view taken along line IV-IV' of FIG. 4 showing a CMOS image sensor according to the present invention.

As shown in FIGS. 4 and 5, the CMOS image sensor includes an isolation layer 102 formed in an isolation area of a P type semiconductor device 101 (having defined thereon and/or therein an active area, including a photodiode (PD) area and a transistor area, and the isolation area), a first P-well area 104 in a predetermined portion of a surface of the active area of the semiconductor device 101, four gate electrodes 108, 115, 125, and 135 formed in the active area of the semiconductor device 101 with a gate insulating layer 107 between the active area and each gate electrode, N+ type diffusion areas 109 formed in the substrate 101 at sides of the gate electrodes 108, 115, 125, and 135, and a second P-well area 106 formed in a floating diffusion area of the semiconductor substrate 101 and having a doping density lower than that of the first P-well area 104.

Among the four gate electrodes 108, 115, 125, and 135, the gate electrode 108 is generally a gate electrode of a reset transistor, the gate electrode 115 is generally a gate electrode of a transfer transistor, the gate electrode 125 is generally a gate electrode of a drive transistor, and the gate electrode 135 is generally a gate electrode of a select transistor.

Meanwhile, the PD area is formed at one side of the gate electrode 115 of the transfer transistor.

An N+ type diffusion area 109, which is a source/drain area of each transistor, is formed in the active area of each transistor, except for the PD area (on one side of the transfer transistor gate 115) and parts of the substrate below the gate electrodes 108, 115, 125 and 135.

In addition, a doping density of the first P-well area 104 is within a range of $1E17/cm^3$ to $1E18/cm^3$, a doping density of the N+ type diffusion area 109 is within a range of $1E20/cm^3$ to $1E22/cm^3$, and a doping density of the second P-well area 106 is within a range of $1E16/cm^3$ to $1E17/cm^3$, although other values providing substantially similar results are also suitable.

The gate electrode 108 shown in FIG. 5 may be a gate electrode of the reset transistor, and the N+ type diffusion area 109, which is (or corresponds to) a floating diffusion (FD)

area, is formed in the active area between the gate electrode 115 of the transfer transistor and the gate electrode 108 of the reset transistor.

Figure 1:
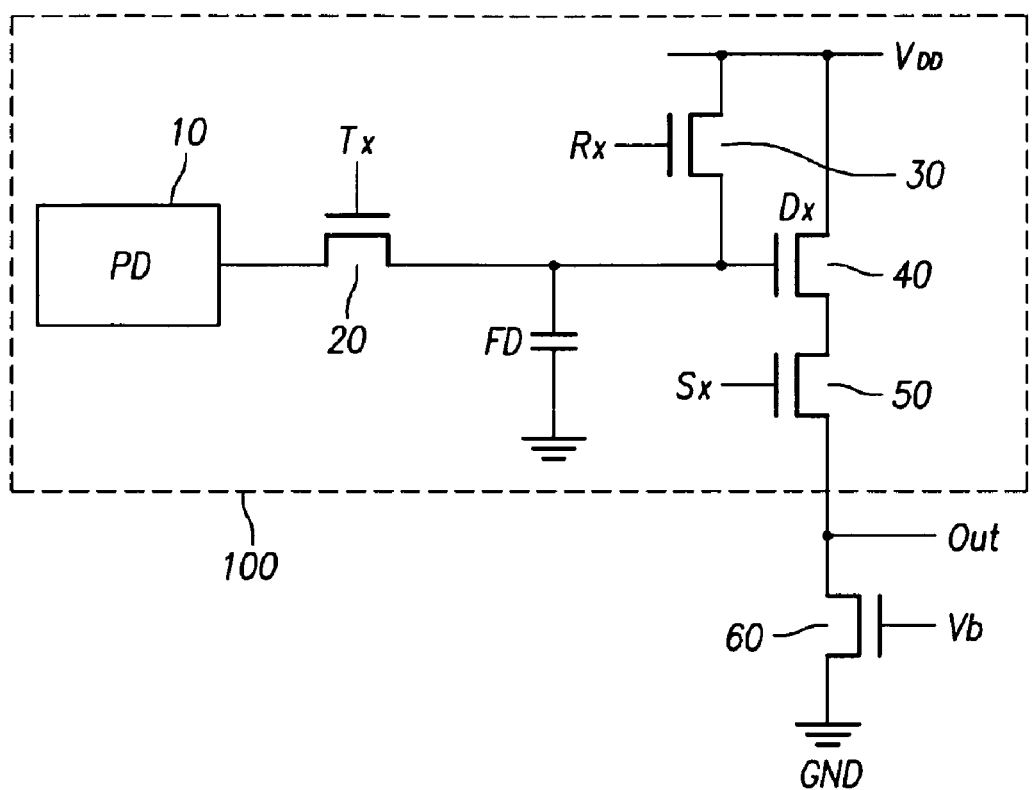
FIG. 1 is a circuit diagram of a conventional four transistor (4T) CMOS image sensor.
Figure 2:
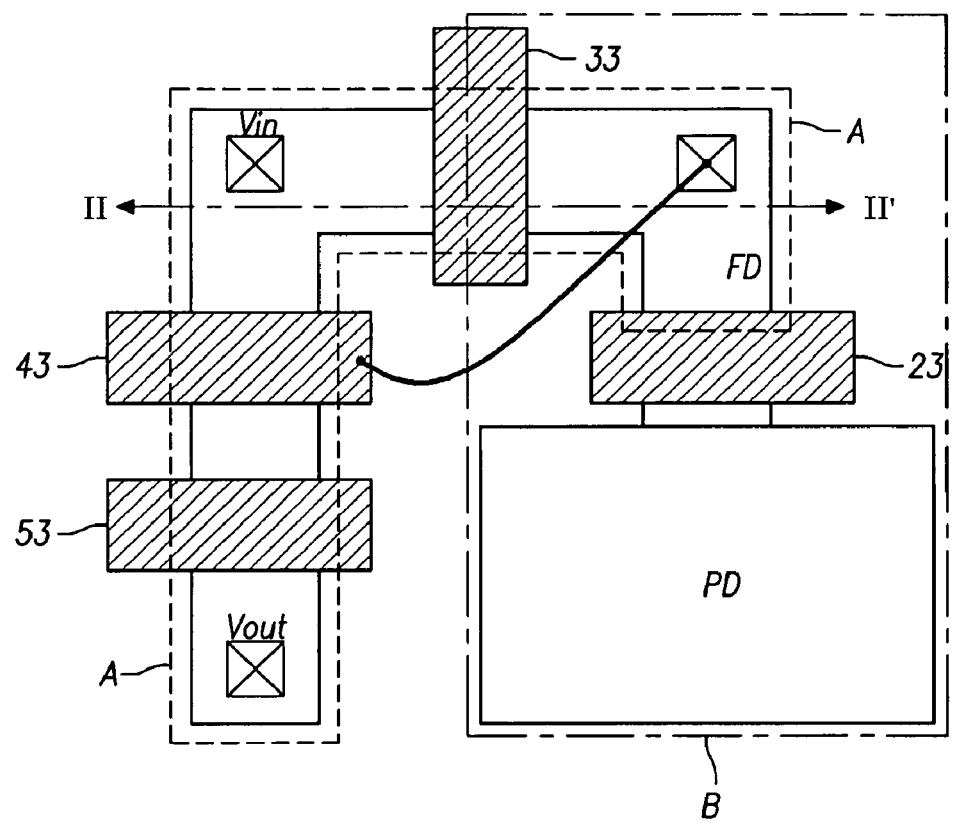
FIG. 2 is a layout view showing a unit pixel of the conventional 4T CMOS image sensor.
Figure 3:
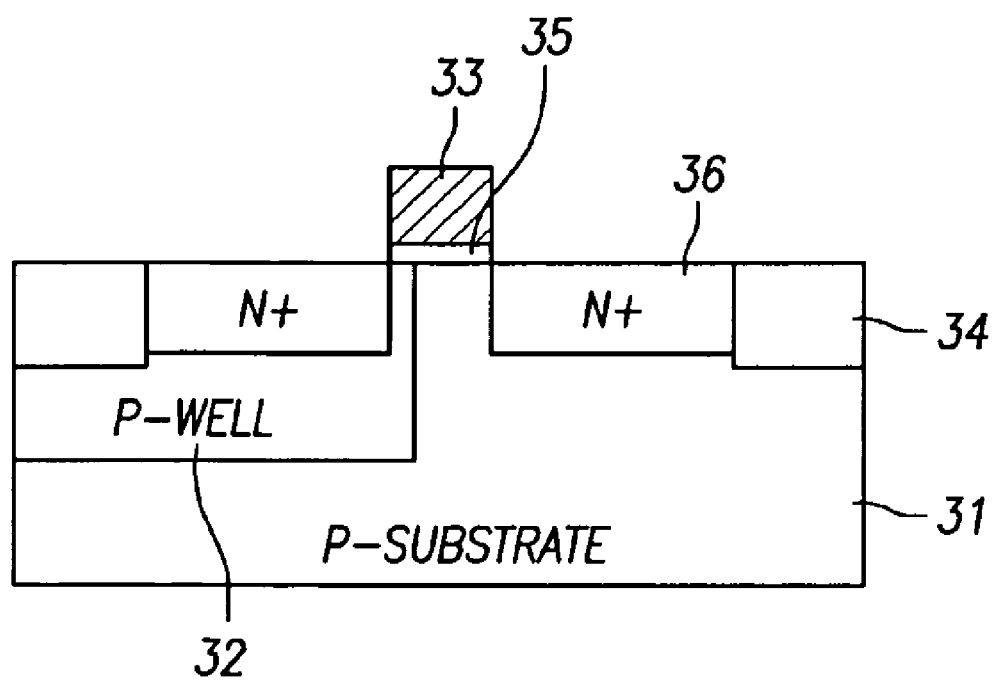
FIG. 3 is a sectional view taken along line II-II' of FIG. 2 showing the conventional CMOS image sensor.

In addition, the bold solid line may represent a connection line for connecting the FD area to the drive transistor 40 (see, FIG. 1).

Meanwhile, in FIG. 4, reference character A represents an area in which the N+ type diffusion areas 109 are formed, reference character B represents an area of the semiconductor device 101 in which the PD is formed and the first P-well 104 is not formed, and reference character C represents an area in which the second P-well area 106 is formed.

In the CMOS image sensor having the above structure according to the present invention, the first P-well area 104 is formed in a voltage input/output (Vin/Vout) area of the active area, which may be divided into the PD area, the FD area, and the voltage input/output (Vin/Vout) area, and the second P-well area 106 having a dopant density lower than that of the first P-well area 104 is formed in the FD area.

FIGS. 6A to 6D are sectional views taken along line IV-IV' of FIG. 4 to show a method for manufacturing the CMOS image sensor according to the present invention.

Figure 6A:
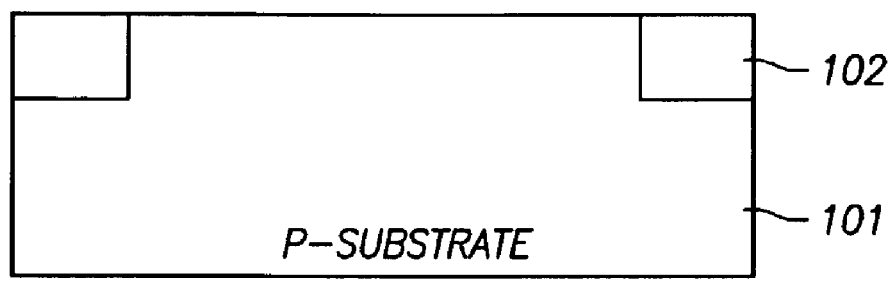
FIGS. 6A to 6D are sectional views taken along line IV-IV' of FIG. 4 to show a method for manufacturing the CMOS image sensor according to the present invention.

As shown in FIG. 6A, the semiconductor substrate 101 (which may comprise P-type single crystal silicon) has one or more active areas and one or more isolation areas defined thereon, and the isolation layer 102 is formed in the isolation areas using a shallow trench isolation (STI) process.

Although it is not illustrated in figures, the method for forming the isolation layer 102 is as follows.

A pad oxide layer, a pad nitride layer, and a tetraethyl orthosilicate (TEOS) oxide layer are sequentially formed on the semiconductor substrate 101, and a photoresist film is formed on the TEOS oxide layer.

Then, exposure and development processes are performed on the photoresist film using a mask defining the active area and the isolation area, thereby patterning the photoresist film. At this time, the photoresist film formed in the isolation area may be removed.

Thereafter, the pad oxide layer, the pad nitride layer, and the TEOS oxide layer in the isolation area are selectively removed using the patterned photoresist film as a mask.

The semiconductor substrate of the isolation area is etched to a predetermined depth thereby forming a trench. At this time, the patterned pad oxide layer, the pad nitride layer, and the TEOS oxide layer may serve as a mask. Then, the photoresist film is completely removed.

Thereafter, the trench is filled therein with insulating material, so the isolation layer 103 is formed in the trench. Subsequently, the pad oxide layer, the pad nitride layer, and the TEOS oxide layer are removed.

Figure 6B:
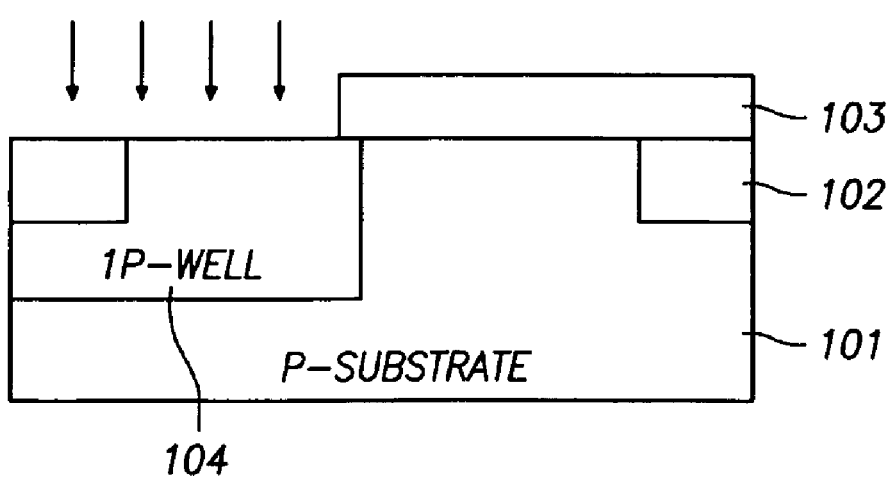

As shown in FIG. 6B, after coating a first photoresist film 103 on the entire surface of the semiconductor substrate 101 having the isolation layer 102, the first photoresist film 103 is patterned through exposure and development processes such that a voltage input/output (Vin/Vout) part of the active area is opened.

Herein, the part A includes the input node (Vin node) area, the output node (Vout node) area, and the floating diffusion (FD) area.

Then, low-density P type dopants are implanted into the semiconductor substrate 101 using the first photoresist film 103 as a mask, thereby forming the first P-well area 104 at and/or in the surface of the semiconductor substrate 101. The P-type dopant generally comprises boron (B). Alternatively, if an N-type substrate is used, the first well 104 may comprise an N-dopant, such as phosphorous (P), arsenic (As) and/or antimony (Sb).

The density of the first P-well area 104 is generally within the range of $1E17/cm^3$ and $1E18/cm^3$.

Figure 6C:
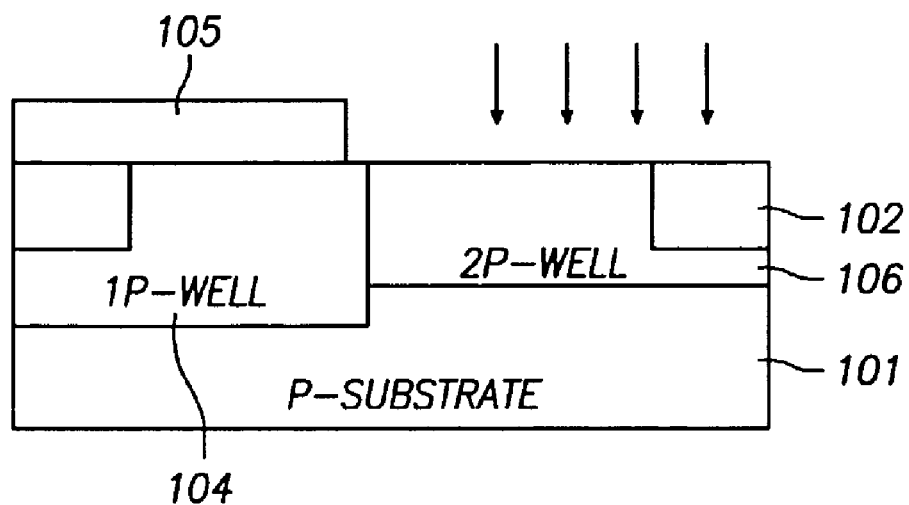

As shown in FIG. 6C, after removing the photoresist film 103 and coating a second photoresist film 105 on the semiconductor substrate 101, the second photoresist film 105 is patterned through exposure and development processes such that the voltage input/output area is covered with the second photoresist film 105. In one embodiment, only the voltage input/output area is covered with the second photoresist film 105. In another embodiment, a region encompassing the floating diffusion area (but generally not extending to the opposite sides of the gates that define the floating diffusion area) is exposed through the second photoresist film 105.

An area opened by the second photoresist film 105 is an area for forming an FD area.

Thereafter, a P type dopant (e.g., boron) having a dopant density lower than that of the first P-well area 104 is implanted into the semiconductor substrate 101 using the second photoresist film 105 as a mask, thereby forming the second P-well area 106 on the surface of the semiconductor substrate 101. Alternatively, if an N-type substrate is used, the second well 106 may comprise an N-dopant, such as phosphorous (P), arsenic (As) and/or antimony (Sb), also at a lower dopant density than the first well 104.

The doping density of the second P-well area 106 is generally within the range of $1E16/cm^3$ and $1E17/cm^3$, and the doping density of the semiconductor substrate 101 where the photodiode is formed is generally within the range of $1E15/cm^3$ and $1E16/cm^3$.

Figure 6D:
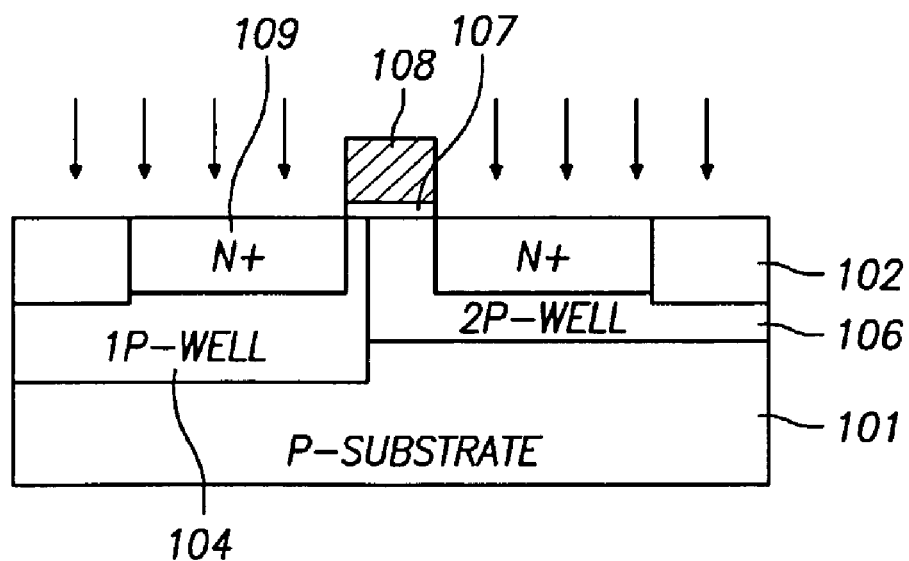

Then, as shown in FIG. 6D, the second photoresist film 105 is removed, the gate insulating layer 107 and a conductive layer (e.g., a polycrystalline silicon layer) are deposited or otherwise formed on the entire surface of the semiconductor substrate 101, and the conductive layer and gate insulating layer is selectively removed through a photolithography process, thereby forming the gate electrode 108 of the reset transistor.

When forming the gate electrode 108 of the reset transistor, the gate electrodes of the other transistors (e.g., the transfer transistor, the drive transistor, and the select transistor) are generally simultaneously formed.

Then, one or more N+ type dopants are implanted into the exposed active area(s) using the gate electrode 108 as a mask, thereby forming high-density N+ type diffusion areas 109. Suitable N+ type dopants include phosphorous (P), arsenic (As) and/or antimony (Sb), generally phosphorous (P).

The N+ type diffusion area 109 generally has a dopant density within a range of from $1E20/cm^3$ and $1E22/cm^3$. Naturally, if an N-type substrate is used, the diffusion areas 109 may comprise a P-dopant, such as boron (B), at the same or a similar dopant density.

Thereafter, the semiconductor substrate 101 is subjected to a heat-treatment process (e.g., a rapid heat-treatment process such a rapid thermal processing [RTP] or rapid thermal annealing [RTA]), thereby diffusing and/or activating dopants in the N+ type diffusion areas 109.

As described above, the CMOS image sensor and the method for manufacturing the same according to the present invention have advantages as follows.

The density of P type dopants in the floating diffusion area of a CMOS image sensor pixel is increased so that the junction capacitance of the floating diffusion area is increased, thereby improving the characteristics of the image sensor.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A CMOS image sensor including a photodiode and a plurality of transistors, the CMOS image sensor comprising:
a first conductive type semiconductor substrate, having an active area including a photodiode area, a floating diffusion area, and a voltage input/output area;
a gate electrode of each of first, second and third transistors on the active area of the semiconductor substrate and a gate insulating layer between each gate electrode and the semiconductor substrate, wherein the gate electrode of the first transistor is over an interface between the photodiode area and the floating diffusion area, the gate electrode of the second transistor is over an interface between the floating diffusion area and the voltage input/output area, and the gate electrode of the third transistor is over the voltage input/output area;
a first conductive type first well area in the semiconductor substrate corresponding to the voltage input/output area;
a first conductive type second well area in the semiconductor substrate corresponding to the floating diffusion area, wherein the first conductive type first well area has (i) a doping density higher than a doping density of the first conductive type second well area and (ii) a greater depth than the first conductive type second well area; and
a second conductive type diffusion area in the semiconductor substrate at opposed sides of each gate electrode.

2. The CMOS image sensor of claim 1, wherein the first and second transistors comprise transfer and reset transistors, respectively.

3. The CMOS image sensor of claim 2, wherein the third transistor comprises one of a drive transistor or a select transistor.

4. The CMOS image sensor of claim 3, further comprising a fourth transistor, the fourth transistor comprising either (i) a drive transistor if the third transistor comprises a select transistor or (ii) a select transistor if the third transistor comprises a drive transistor.

5. The CMOS image sensor of claim 1, wherein the first transistor comprises a transfer transistor having the second conductive type diffusion area in the floating diffusion area at one side of its gate electrode.

6. The CMOS image sensor of claim 1, wherein the second conductive type diffusion area is a source/drain area of each transistor.

7. The CMOS image sensor of claim 6, wherein the first and second transistors comprise transfer and reset transistors, and the third transistor comprises one of a drive transistor or a select transistor.

8. The CMOS image sensor of claim 6, wherein the source/drain area is in the active area of each transistor except for the first transistor.

9. The CMOS image sensor of claim 8, wherein the first transistor comprises a transfer transistor having the second conductive type diffusion area in the floating diffusion area at one side of its gate electrode.

10. The CMOS image sensor of claim 9, wherein the floating diffusion area is in the active area between the gate electrode of the first transistor and the gate electrode of the second transistor.

11. The CMOS image sensor of claim 1, further comprising one or more isolation areas.

12. The CMOS image sensor of claim 1, wherein the first conductive type is P type and the second conductive type is N type.

13. The CMOS image sensor of claim 12, wherein the P type dopant comprises boron (B).

14. The CMOS image, sensor of claim 1, wherein the first conductive type is N type and the second conductive type is P type.

15. The CMOS image sensor of claim 14, wherein the N type dopant comprises phosphorous (P), arsenic (As), or antimony (Sb).

16. The CMOS image sensor of claim 1, further comprising a connection line connecting the floating diffusion area to the drive transistor.

17. The CMOS image sensor of claim 4, further comprising a gate electrode of the fourth transistor, wherein the gate electrode of the fourth transistor is over the voltage input/output area.

18. The CMOS image sensor of claim 5, wherein the first transistor has the photodiode area at an opposite side of its gate electrode from the floating diffusion area.

19. The CMOS image sensor of claim 7, further comprising a fourth transistor, the fourth transistor. comprising either (i) a drive transistor if the third transistor comprises a select transistor or (ii) a select transistor if the third transistor comprises a drive transistor.

20. The CMOS image sensor of claim 10, wherein the voltage input/output area is in the active area at a side of the gate electrode of the second transistor opposite from the gate electrode of the first transistor.

* * * * *